United States Patent
Camara et al.

(10) Patent No.: US 7,332,956 B2
(45) Date of Patent: Feb. 19, 2008

(54) METHOD TO AVOID DEVICE STRESSING

(75) Inventors: Hibourahima Camara, Beacon, NY (US); Louis C. Hsu, Fishkill, NY (US); James D. Rockrohr, Hopewell Junction, NY (US); Karl D. Selander, Hopewell Junction, NY (US); Huihao Xu, Brooklyn, NY (US); Steven J. Zier, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/163,688

(22) Filed: Oct. 27, 2005

(65) Prior Publication Data
US 2007/0096797 A1 May 3, 2007

(51) Int. Cl.
*G05F 1/10* (2006.01)
(52) U.S. Cl. ............... 327/540; 327/530
(58) Field of Classification Search ........... 327/333, 327/530, 538, 540, 541, 543; 323/312, 313, 323/315, 316
See application file for complete search history.

(56) References Cited
U.S. PATENT DOCUMENTS

| | | | | |
|---|---|---|---|---|
| 4,210,829 A | * | 7/1980 | Wong et al. | 327/546 |
| 5,315,167 A | * | 5/1994 | Chan et al. | 327/537 |
| 5,369,312 A | | 11/1994 | Oh et al. | 327/545 |
| 5,489,902 A | * | 2/1996 | Shyu et al. | 341/136 |
| 5,726,589 A | | 3/1998 | Cahill et al. | 326/81 |
| 5,982,225 A | * | 11/1999 | Forhan et al. | 327/538 |
| 6,377,075 B1 | | 4/2002 | Wong et al. | 326/83 |
| 6,717,460 B2 | * | 4/2004 | Yamauchi et al. | 327/544 |
| 6,778,349 B2 | * | 8/2004 | Ricotti et al. | 360/75 |
| 6,897,712 B2 | * | 5/2005 | Ficken et al. | 327/537 |
| 6,922,098 B2 | * | 7/2005 | Choi et al. | 327/538 |
| 7,012,417 B2 | * | 3/2006 | McClure | 323/318 |
| 2006/0145751 A1 | * | 7/2006 | Gangasani et al. | 327/543 |

* cited by examiner

*Primary Examiner*—Kenneth B. Wells
*Assistant Examiner*—Thomas J. Hiltunen
(74) *Attorney, Agent, or Firm*—Scully, Scott, Murphy & Presser, P.C.; H. Daniel Schnurmann

(57) ABSTRACT

A system for protecting a weak device operating in microelectronic circuit that includes a high voltage power supply from high voltage over stressing prevents the weak device from failing during power-up, power-down, and when a low voltage power supply in a multiple power supply system is absent. The system includes a low voltage power supply detection circuit configured to detect circuit power-up, circuit power-down, and when the low voltage power supply is absent, and generate a control signal upon detection. The system further includes a controlled current mirror device configured to provide a trickle current to maintain a conduction channel in the weak device in response to the control signal received from the low voltage power supply detection circuit during circuit power-up, circuit power-down, and when the low voltage power supply is absent.

19 Claims, 5 Drawing Sheets

| Vtr | Vdd | PDWN | NODE 350 | TRICKLE CURRENT |
|---|---|---|---|---|
| Y | Y | 1 | 0 | Y |
| Y | Y | 0 | 1 | N |
| N | Y | 1/0 | FLOAT LOW | N |
| Y | N | FLOAT LOW | 0 | Y |

METHOD TO AVOID DEVICE STRESSING

The invention relates generally to semiconductors and more particularly to a protection system for weak devices in a micro-electronic circuit system during power-down, power-up, and/or when a lower power supply of a multiple power supply system is absent.

BACKGROUND INFORMATION

Mixed signal systems typically consist of a digital core, including a CPU or digital signal processor (DSP), and various memory blocks. The core may be surrounded by analog interface electronics such as I/O, digital-to-analog and analog-to-digital converters, and RF front ends, for example. Micro-electronic circuit systems can also be a centralized analog core, including a receiver and/or a transmitter complex, which are surrounded by a variety of digital circuitry. A CMOS micro-electronic circuit chip includes CMOS digital and analog circuits. The analog circuits are constrained to function in tandem with the digital design, which is dictated by CMOS evolution. In particular, the harmonic-distortion components of transistors (or noise) increase drastically as power supply voltages for digital circuits decrease.

As power supply voltages continue to decrease with advancing technologies, it is becoming increasingly difficult to raise the performance of analog circuits. This is because the threshold voltages of the various analog devices cannot be scaled along with the decreasing power supply voltages. In order to increase performance for certain high-speed critical circuits, high supply voltages are often necessary, while using the low threshold weak devices wherever possible to get maximum circuit overdrive. Moreover, systems developed under new technologies are optimized to be powered by a low voltage power supply, but are still required to be compatible to old legacy systems, which operate in a high voltage power supply environment. Thus, analog circuit designers are faced with the challenge of preventing low threshold weak devices from being overstressed, or broken down, and preventing hot electron performance degradation in a multiple power supply system.

Gate leakage current in semiconductor transistor devices mainly depends on gate to substrate voltage, source or drain bias voltage, and gate dielectric thickness and size. As the MOS technology advances, gate dielectric becomes thinner and is increasingly exposed to gate leakage problems, especially when the gate dielectric (e.g. $SiO_2$) is stressed at high voltage. The net effect of gate leakage is undesired and uncontrollable input bias current, gate leakage mismatch, and shot noise. The input bias currents caused by gate leakage are very similar to the base currents of bipolar devices, except the width and length of the MOS devices can be optimized. The input impedance of a MOS device consists of the conventional input capacitance and a parallel tunnel resistance due to gate leakage. With respect to 90 nm scale devices, for signal frequencies higher than 1 MHz, the input impedance is capacitive and the MOSFET behaves as a conventional MOS. At lower signal frequencies, the input impedance is resistive and the gate leakage is dominant. Therefore, thin-dielectric MOS capacitances are not suitable for certain low-frequency applications like PLL filters and hold circuits.

Gate leakage mismatch typically exceeds conventional threshold mismatch tolerances. Matching gate leakage usually limits the achievable level of performance for analog circuits. One way to reduce the threshold related mismatch effect is to increase the chip area. However, gate leakage mismatch then acts as an extra spread source and places an upper bound on the area that can be used to decrease threshold mismatch. When increasing the chip area, the conventional threshold spreading contribution decreases, but the gate leakage spread contribution increases. As the result, the maximum usable transistor area is limited by gate leakage spread. The problem becomes more significant in the 65 nm and 45 nm scale generations. Typically, the maximum area is about 103 $\mu m^2$ or less. To reduce gate leakage, one design strategy involves providing a high voltage to critical parts of the circuitry so that these circuits can be built with transistors having thicker gate dielectrics. MOS lifetime is dominated by vertical and lateral electric fields and electric fields across the junctions. Three lifetime determining mechanisms that relate to these electric fields are denoted as dielectric breakdown, hot-carrier degradation, and junction breakdown. However, this design strategy does not work with analog circuits. In order to achieve proper circuit performance, some analog circuit devices must be low threshold weak devices.

Various methods to reduce voltage stress on the digital I/O circuits have been proposed. One such method involves using cascade circuits to protect devices from high voltage stress. However, this method is not useful for analog circuits because all the signals in the analog circuits do not swing from rail to rail.

Another method to avoid hot carrier related problems involves delaying turning on a transistor until the drain and source have dropped below the characteristic hot carrier operation voltage. However, this method ignores the problem of gate dielectric stress.

Still another method to avoid hot carrier problems involves cascading devices and biasing intermediate node voltages to half the power supply level. This method only works well when the power supply level is sufficiently higher than the sum of the threshold levels of the cascaded devices. Otherwise, certain analog devices cannot operate properly due to lack of power supply headroom. Further, as the power supply level is reduced, and the technology is further scaled down, this method becomes impracticable. This method also fails to address how to avoid gate dielectric stress.

SUMMARY OF THE INVENTION

The invention relates generally to the field of semiconductors and more particularly to a protection system for weak devices in a micro-electronic circuit system during power-down, power-up, and/or when a lower supply of a multiple power supply system is absent.

In one aspect, the invention involves a system for protecting a weak device operating in a micro-electronic circuit including a high voltage power supply. The system includes a low voltage power supply detection circuit configured to detect circuit power-up, circuit power-down, and when the low voltage power supply is absent, and generate a control signal upon detection. The system further includes a controlled current mirror device configured to provide a trickle current to maintain a conduction channel in the weak device in response to the control signal received from the low voltage power supply detection circuit during circuit power-up, circuit power-down, and/or when the low voltage power supply is absent.

In one embodiment, the low voltage power supply detection circuit is configured to be in electrical communication with an output of a low voltage power supply and an output of the high voltage power supply. The controlled current mirror device is configured to be in electrical communication with the output of the low voltage power supply, the output of the high voltage power supply, and the weak device, and in electrical communication with the low voltage power supply detection circuit. In another embodiment, the system further includes a reference current generator configured to be in electrical communication with the weak device and in electrical communication with the controlled current mirror device. The reference current generator is further configured to provide a reference current to the weak device during normal circuit operation. The controlled current mirror device is further configured to receive the reference current and selectively provide to the weak device the reference current or the trickle current in response to the control signal received from the low voltage power supply detection circuit. In yet another embodiment, the trickle current provided to maintain the conduction channel in the weak device is within the range of 0.1 µA to 10 µA. In still another embodiment, the weak device is a thin gate dielectric device, a short channel device, and/or a small width device. In other embodiments, the conduction channel prevents voltages across a gate of the weak device from exceeding a tolerable limit. In still other embodiments, the high voltage power supply produces a voltage of greater than or equal to 1.3 volts and the low voltage power supply produces a voltage of less than 1.3 volts. In another embodiment, the controlled current mirror device includes a mirror current device and a trickle current device.

In another aspect, the invention involves a method of protecting a weak device operating in a micro-electronic circuit including a high voltage power supply. The method includes providing a low voltage power supply detection circuit configured to detect circuit power-up, circuit power-down, and when the low voltage power supply is absent, and generate a control signal upon detection. The method further includes providing a controlled current mirror device configured to provide a trickle current to maintain a conduction channel in the weak device in response to the control signal received from the low voltage power supply detection circuit during circuit power-up, circuit power-down, and/or when the low voltage power supply is absent.

In one embodiment, the low voltage power supply detection circuit is configured to be in electrical communication with an output of a low voltage power supply and an output of the high voltage power supply. The controlled current mirror device is configured to be in electrical communication with the output of the low voltage power supply, the output of the high voltage power supply, and the weak device, and in electrical communication with the low voltage power supply detection circuit. In another embodiment, the method further includes providing a reference current generator configured to be in electrical communication with the weak device and in electrical communication with the controlled current mirror device. The reference current generator is further configured to provide a reference current to the weak device during normal circuit operation. The controlled current mirror device is further configured to receive the reference current and selectively provide to the weak device the reference current or the trickle current in response to the control signal received from the low voltage power supply detection circuit. In still another embodiment, the trickle current provided to maintain the conduction channel in the weak device is within the range of 0.1 µA to 10 µA. In other embodiments, the weak device is a thin gate dielectric device, a short channel device, and/or a small width device.

In still another aspect, the invention involves a high-speed micro-electronic circuit system including a system for protecting weak devices. The system for protecting weak devices includes a low voltage power supply detection circuit in electrical communication with an output of a low voltage power supply and an output of a high voltage power supply. The low voltage power supply detection circuit is configured to detect circuit power-up, circuit power-down, and/or when the low voltage power supply is absent, and generate a control signal upon detection. The system for protecting weak devices further includes a controlled current mirror device in electrical communication with the output of the low voltage power supply, the output of the high voltage power supply, the weak devices, and the low voltage power supply detection circuit. The controlled current mirror device provides a trickle current to maintain a conduction channel in each of the weak devices in response to the control signal received from the low voltage power supply detection circuit during circuit power-up, circuit power-down, and/or when the low voltage power supply is absent.

In yet another aspect, the invention involves a method for setting a trickle current for a weak device the method includes (a) identifying the weak device, (b) powering down the weak device or putting the weak device in a stand-by mode, and (c) setting the trickle current to substantially zero amperes. The method further includes (d) measuring a gate to source voltage (Vgs), a drain to source voltage (Vds), and a gate to drain voltage (Vgd) for the weak device to determine if any of Vgs, Vds, and Vgd are above a tolerable limit. The method further includes (e) increasing the trickle current incrementally if any of Vgs, Vds, and Vgd are above the tolerable limit. The method further includes repeating steps (d) and (e) until Vgs, Vds, and Vgd are below the tolerable limit.

The foregoing and other objects, aspects, features, and advantages of the invention will become more apparent from the following description and from the claims.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

The invention relates generally to the field of semiconductors and more particularly to a protection system for weak devices in a micro-electronic circuit system during power-down, power-up, and/or when a low voltage power supply (less than 1.3V) of a multiple power supply system is absent. Weak devices include thin gate dielectric devices (the dielectric is thinner than approximately 3 nm), short channel devices (the channel is less than or equal to approximately 90 nm), and small width devices (the width is less than or equal to approximately 480 nm).

When a micro-electronic circuit system operates with a high voltage supply (greater than or equal to 1.3V), weak devices (e.g., a transistor) must be protected from such high voltages because the gate dielectrics become overstressed. Consequences of over stressing gate dielectrics include undesirable increased gate leakage currents, increased device mismatch due to gate leakage mismatch, degradation of micro-electronic circuit performance, hot electron effects, gate punch-through, and/or total weak device failure due to gate dielectric breakdown.

The present invention provides a protection system for weak devices during circuit/system power-down, power-up, and/or when a low voltage power supply (0.8V to 1.2V) of a multiple power supply system is absent. The stress protection system includes a reference current distribution system (which provides a reference current between 10 μA to 200 μA), a low voltage power supply level detection circuit, and a controlled current mirror device. During normal circuit/system operation, the reference current generator provides a reference current to the micro-electronic circuit system. When the low voltage power supply level detection circuit detects power-down, power-up, or when a low voltage power supply is absent, the controlled current mirror device (CMD) provides a trickle current and mirrors the trickle current to the weak devices. The purpose of the trickle current is to maintain a channel in MOSFET devices so that voltage stress across the gate dielectric is split into the diffusion junction (or channel) region to avoid damage to the gate. Further, voltage stress across the source/drain of the device is split by multiple devices stacked in the circuit.

Figure 1:
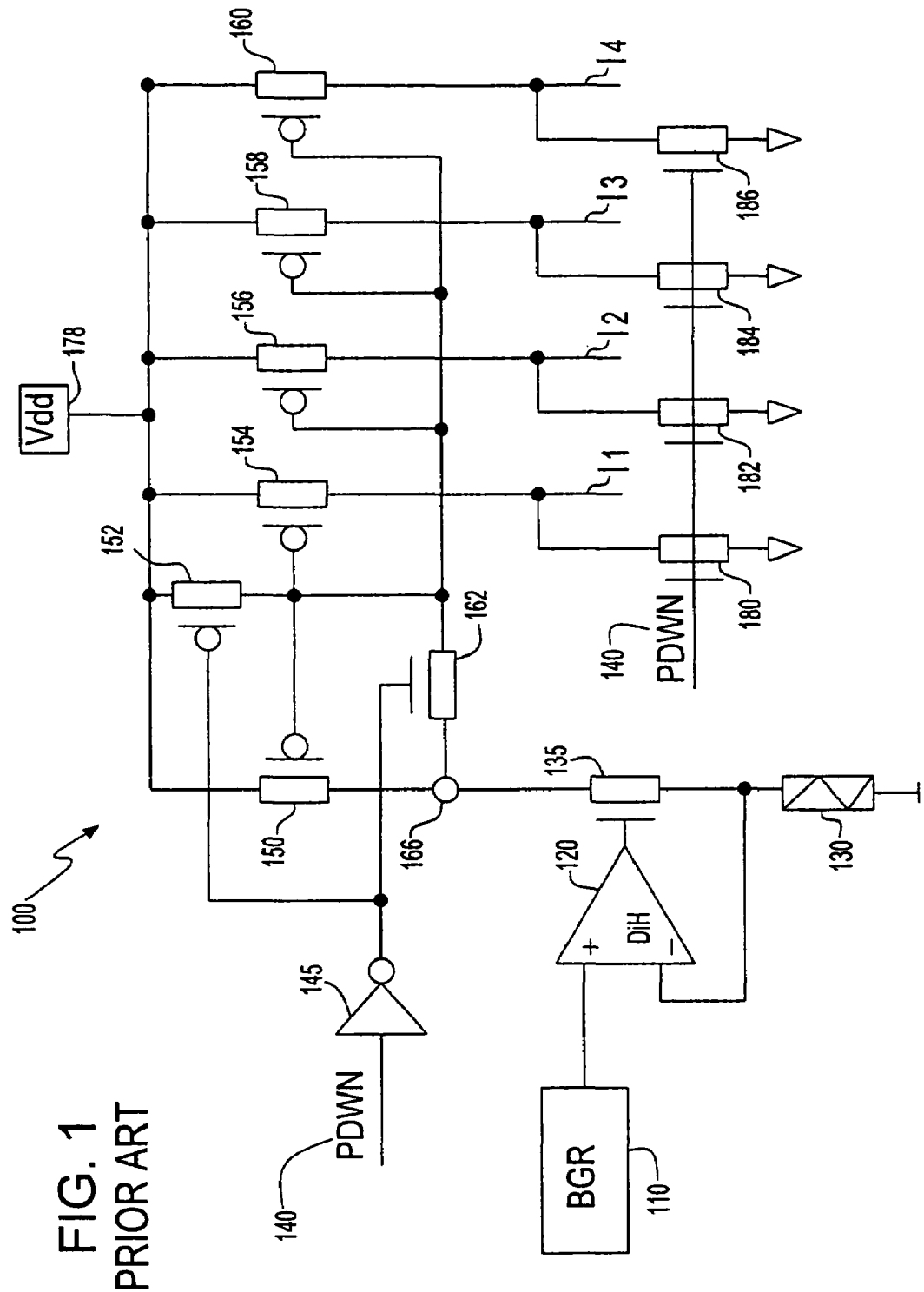
FIG. 1 is an illustrative schematic diagram of a prior art current reference circuit including a power-down control pin.

Referring to FIG. 1, a conventional reference current circuit 100 is shown. The conventional reference current circuit includes a power-down control pin (PDWN) 140, an inverter 145, PMOS devices 152, 150, 154, 156, 158, and 160, NMOS device 162, pull-down devices 180, 182, 184, 186, a band gap reference (BGR) 110, a differential amplifier 120, an NMOS device 135, and a pull-down resistor 130. The conventional reference current circuit 100 is powered by a low voltage power supply Vdd 178.

In operation, reference currents I1, I2, I3, and I4 are generated through the BGR 110 via a differential amplifier 120 and a feedback control circuit including NMOS device 135 and the PMOS device 150. During power-down (PDWN=1), the feedback is cut off, the NMOS device 162 is off, and the PMOS device 152 turns on thereby turning off mirror devices 154, 156, 158, and 160. The reference currents I1, I2, I3, and 176 are consequently pulled down to ground. When the power-down is complete (PDWN=0), feedback is established and the generated current at node 166, which is equal to Vbgr divided by the resistor 130, will be proportionally mirrored to other devices.

Figure 2:
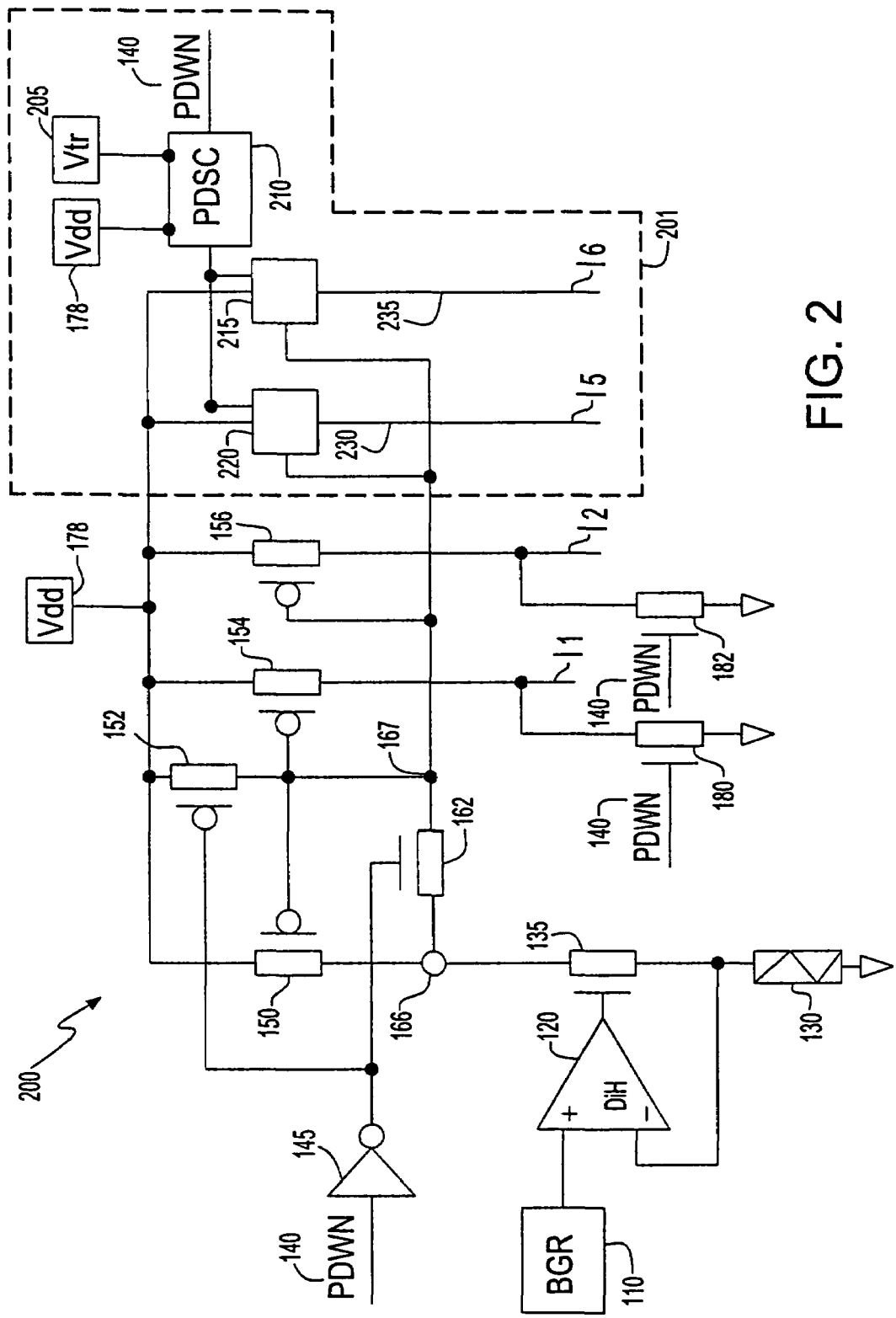
FIG. 2 is an illustrative schematic diagram of a reference current generator, according to another embodiment of the invention.

Referring to FIG. 2, in one embodiment, a reference current generator 200 is shown. The reference current generator 200 includes some of the circuit elements of the reference current generator 100, shown in FIG. 1. Specifically, the reference current generator 200 includes the power-down control pin (PDWN) 140, the inverter 145, the PMOS devices 152, 150, 154, and 156, the NMOS device 162, the pull-down devices 180, 182, the band gap reference (BGR) 110, the differential amplifier 120, the NMOS device 135, and the pull-down resistor 130. The reference current generator 200, in one embodiment, includes additional circuitry 201 shown in the dashed box. The additional circuitry 201 includes a power-down sensing or detection circuit (PDSC) 210, and controlled current mirror devices (CMD) 220, and 215. The reference current system 200 is a multiple power supply system powered by low voltage power supply (0.8V to 1.2V) Vdd 178 and high voltage power supply (1.3V to 1.8V) Vtr 205 (termination voltage).

The reference currents I1, and I2, previously described above, are reference bias currents to circuits that do not have gate dielectric stress concerns and can be powered down normally. Reference currents I5 and I6 are reference bias currents for weak devices that are powered by the power supply Vtr 205 and cannot be completely powered-down. During normal circuit operation, node 230 and node 235 will have the reference currents I5 and I6, respectively. During power-up, power-down, and/or when the low voltage power supply Vdd 178 is missing, node 230 and node 235 will have a trickle current, as is explained in further detail below.

The PDSC 210 is a low voltage power supply sensing or detection circuit that detects circuit power-down, circuit power-up, or the absence of the lower voltage power supply Vdd 178. For example, if during power-up, the high voltage power supply Vtr 205 turns on ahead of the low voltage power supply Vdd 178, or the low voltage power supply Vdd 178 is removed or interrupted, the weak devices could be damaged. Therefore, the PDSC 210 is used to detect when the low voltage power supply Vdd 178 is missing.

The CMD 220 and the CMD 215 are controlled by the PDSC 210 to produce either a reference current during normal operation or a trickle current during circuit power-up, circuit power-down, or when missing the low voltage power supply Vdd 178). The trickle current is approximately 0.1 μA to 10 μA and is mirrored to the source of each weak device to maintain the channel of each weak device so that proper voltages (<1.2V) are maintained across each weak device to avoid excessive stress on the gate dielectric of each weak device and prevent each weak device from breaking down. For example, for a MOSFET device with a gate dielectric thinner than 3 nm, voltages of greater than 1.2V applied to Vgs and Vgd typically result in hot-carrier effects. Moreover, application of such voltages for long periods of time typically result in changes to the device's threshold voltage.

Figures 3A, 3B:
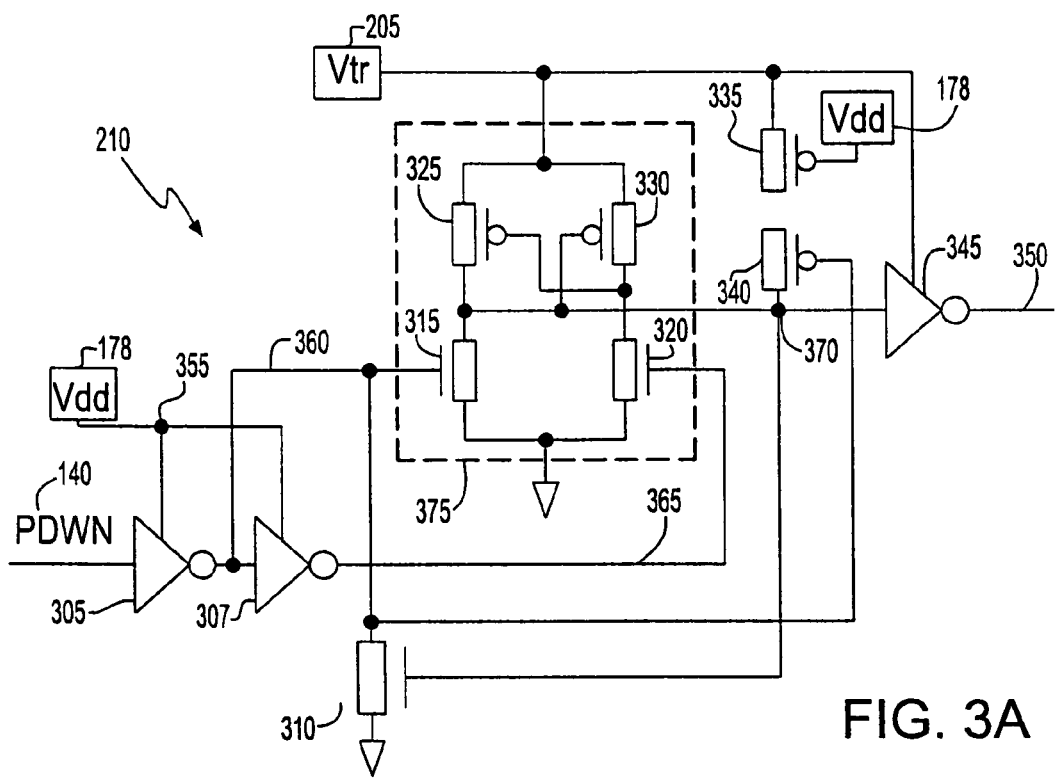
FIG. 3A is an illustrative schematic diagram of a power-down sensing circuit, according to one embodiment of the invention.
FIG. 3B is a truth table for the operation of the power-down sensing circuit shown in FIG. 3A.

Referring to FIG. 3A, in one embodiment, the PDSC 210 includes two input inverters 305 and 307, a pull down NMOS device 310, a level shifter 375, two pull up PMOS devices 335 and 340, and one output inverter 345. The level shifter 375 includes PMOS device 325 and 330, and NMOS devices 315 and 320. The PDSC 210 detects either power-down via the PDWN signal 140 or via the absence of the low voltage power supply Vdd 178.

In operation, when the low voltage power supply Vdd 178 is absent, node 355 floats low due to pull down of the leakage currents from other circuits on the chip. Thus, node 360 and 365 both float low. PMOS devices 335 and 340 turn on, and node 370 is pulled high to the voltage of the high voltage power supply Vtr 205 and node 350 is pulled low to ground by the inverter 345. Therefore, when PDWN 140=1, or node 355 floats low, the output of the PDSC 210 will be held low at ground. The NMOS device 310 adds a positive feedback to the level shifter 375 to overcome any possible coupling noise to node 360.

When PDWN 140=0 and the low voltage power supply Vdd 178 is present, node 360 is high at the voltage of low voltage power supply Vdd 178, and node 365 is low. Further, node 370 is low, which shuts off the NMOS device 310, and node 350 is high. The PMOS devices 340 and 335 together form a weak pull up resistor and therefore, the NMOS devices 315 and 320 are designed to be strong enough to overcome the weak pull up contributed by the PMOS devices 335 and 340. When PDWN=0, both the NMOS devices 335 and 340 are slightly on and try to pull up node 370 toward Vtr. The NMOS device 315 is strongly on and tries to pull down node 370 to ground. Thus, the NMOS device 315 is fighting against the NMOS devices 335 and 340. As the NMOS devices 335 and 340 are designed to be very weak or, alternatively the NMOS device 315 is designed to be stronger than the NMOS devices 335 and 340, the NMOS device 315 will prevail when PDWN=0, and pull node 370 to ground voltage. However, in the case of PDWN=1, the NMOS devices 335 and 340 help to pull up node 370 toward Vtr.

FIG. 3B is a truth table which summarizes the operation of the PDSC 210 described above and shown in FIG. 3A.

Figure 4:
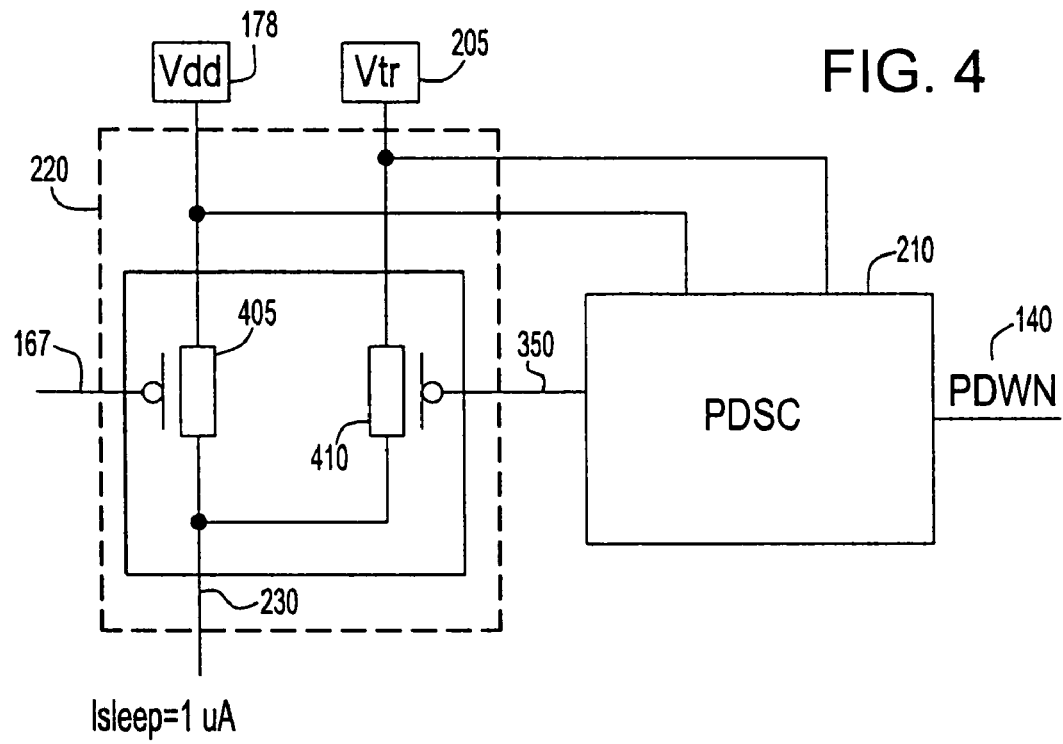
FIG. 4 is an illustrative schematic diagram of a controlled current mirror device in electrical communication with the power-down sensing circuit shown in FIG. 3, according to another embodiment of the invention.

Referring to FIG. 4, in one embodiment, the controlled current mirror device (CMD) 220 (or 215) includes PMOS devices 405 and 410. The PMOS device 405 is a real mirror device, which has a specific size (such as channel width and length, for example) to map the reference current from the PMOS device 150 of the reference circuit shown in FIG. 2. The PMOS device 410 is a trickle current device. The PMOS device 410 is relatively small in size and used to pass a small amount of current (i.e. trickle current, also referred to as Isleep) to each circuit. When the low voltage power supply Vdd 178 is absent or during power-down (PWDN 140 is 1 and node 350 is 0), the PMOS device 410 switches on. A trickle current of 1 µA, for example, will be supplied to each weak device (on node 230, for example) from the high voltage power supply Vtr 205 to maintain the channel in each weak device so that the gate dielectric of each weak device will not be overstressed. However, if the high voltage power supply Vtr 205 is not present, then no current is provided and the gate dielectrics of the weak devices will not be stressed.

Figure 5:
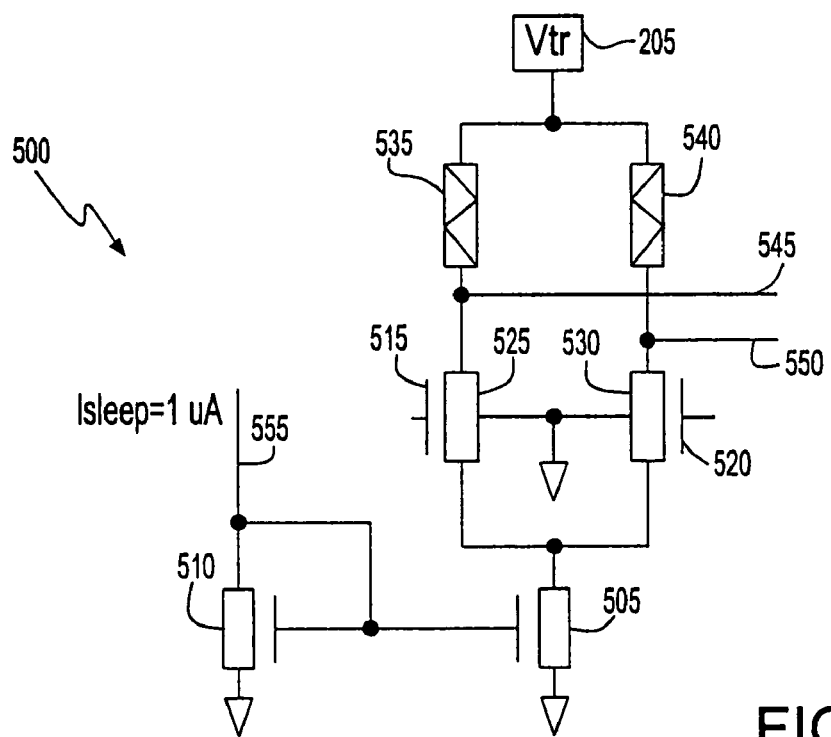
FIG. 5 is an illustrative schematic diagram of a current mode logic buffer, according to still another embodiment of the invention.

Referring to FIG. 5, an example is shown of a current mode logic (CML) 500 buffer utilizing a trickle current supplied from the weak device protection system described above. The supplied trickle current is approximately 1 µA at node 555. The gate voltages of the input devices 515 and 520 are controlled by circuitry not shown, which at power-up, power-down, or when Vdd 178 is not present, pulls the gate voltage close to Vtr. The trickle current is mirrored to the source of the NMOS tail device 505 via the NMOS device 510. When the CML 500 is in standby mode (power-up, power-down, or when Vdd is not present), the trickle current will split the total voltage Vtr across input device 515 and 520 and NMOS tail device 505 acting as a resistive divider. The voltages across input NMOS device 515, input NMOS device 520, and the NMOS tail device 505 are then in safe ranges, (e.g. less than 1.2V). The stress of Vgd, Vgs, and Vds will all be less than the stress tolerable limit (e.g. less than 1.2V). The stress of Vgx (gate to substrate voltage) is not a concern because the trickle current induces a channel in the NMOS devices 515, 520, and 505, which shield the bulk from the gate during power down. In other words, the voltage being truly applied to gate dielectric is not the full amount of Vgx, but approximately half of Vgx. Therefore, the CML circuit 500 will remain reliable during power-up, power-down or when the low voltage power supply Vdd 178 is absent.

Figure 6:
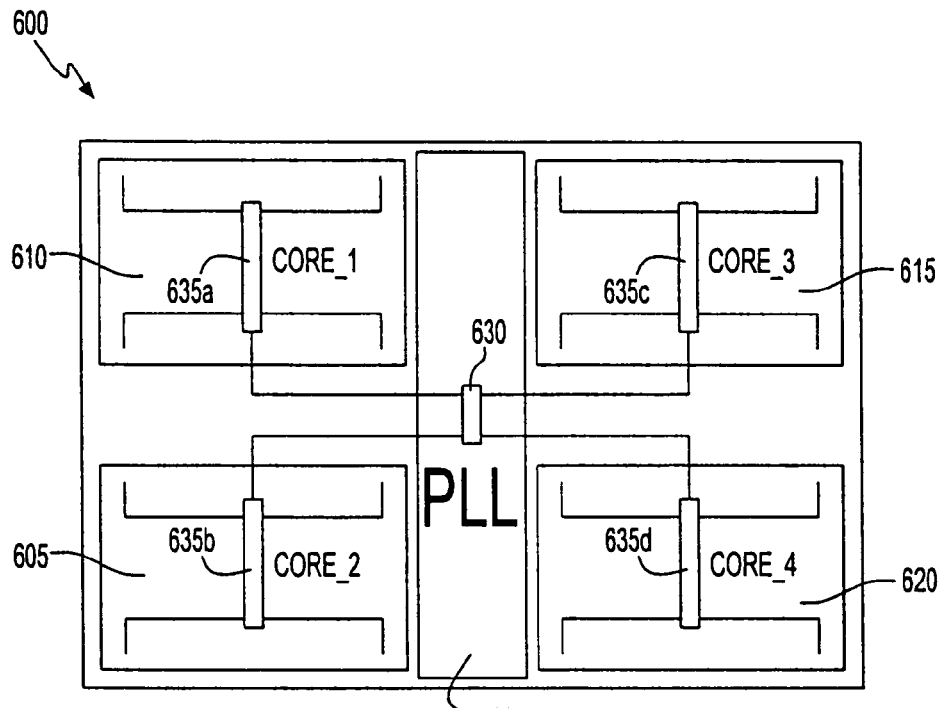
FIG. 6 is an illustrative block diagram of 6.4 Gigahertz High Speed SerDes including a current reference generator, according to yet another embodiment of the invention.

By forcing a small amount of current (e.g. 0.1 µA) through the channel region of each of the weak devices, the channel region in each of the weak devices is maintained during power-up, power-down, or when Vdd is absent. The channel region forms a diffusion capacitor, which is in serial with the gate capacitor so that voltage across the gate to the substrate is split between these two capacitors connected in serial. The net voltage across the gate of each of weak devices with the trickle current flowing through the channel of each weak device is smaller compared to the net voltage across the gate of each weak devices without the trickle current flowing though the channel of each weak device. The end result is that each weak device will not be damaged Referring to FIG. 6, in one embodiment, the system to protect gate dielectrics in weak devices from being overstressed is implemented in a high-speed micro-electronic circuit system. Specifically, the system is implemented in a 6.4 Gigahertz High Speed SerDes (HSS) 600. The HSS 600 includes four analog receiver cores Core_1 605, Core_2 610, Core_3 615, and Core_4 620, which share a Phase Locked Loop (PLL) based clock generator 625. The PLL 625 includes the BGR 110, the differential amplifier 120, the NMOS device 135, and the resistor 130 (shown in FIG. 2). The BGR 110 and the differential amplifier 120 are represented by block 630.

The generated reference current is distributed to each of the four analog receiver cores Core_1 605, Core_2 610, Core_3 615, and Core-4 620. Within each receiver core Core_1 605, Core_2 610, Core_3 615, and Core_4 620, is a power-down controlled current mirror portion 635a, 635b, 635c, 635d, respectively. Each power-down controlled current mirror portion 635a, 635b, 635c, 635d is configured to send the reference current to each port of the respective analog receiver core Core_1 605, Core_2 610, Core_3 615, and Core_4 620. Each power-down controlled current mirror portion 635a, 635b, 635c, 635d includes a PDSC 210 (shown in FIG. 2 and described in detail above) to detect power-down, power-up, and when the low voltage power supply Vdd 178 is absent. In normal operation, the PDSC 210 will output a high signal to shut down the trickle current. During power-down, power-up, or when the low voltage power supply Vdd 178 is absent, the PDSC 210 will output a low signal to switch on the trickle current which is supplied to sensitive weak devices within the analog receiver cores Core_1 605, Core_2 610, Core_3 615, and Core_4 620 to maintain the channel in each of the weak devices.

Figure 7:
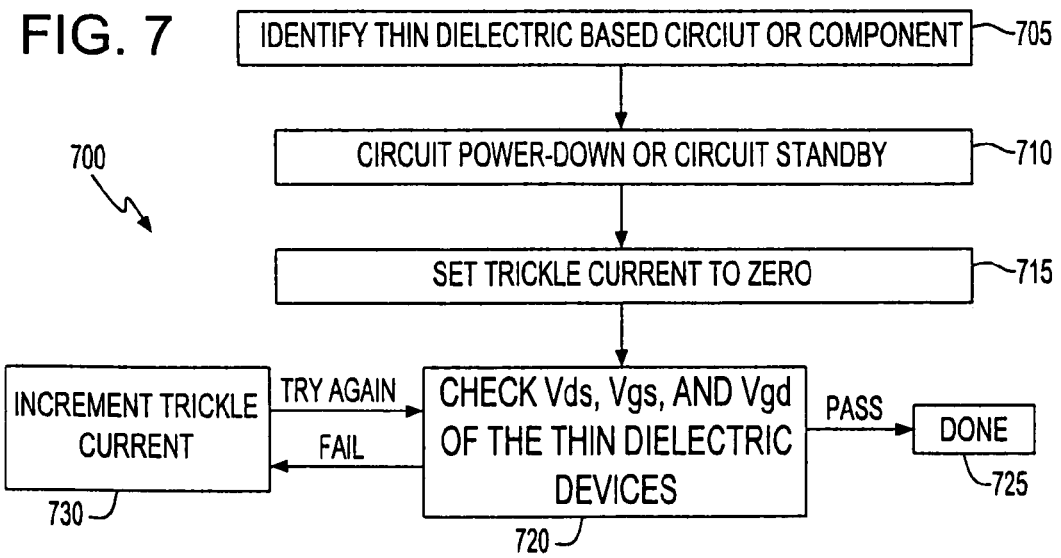
FIG. 7 is an illustrative flow diagram for a method of setting a trickle current for a target weak device, according to one embodiment of the invention.

Referring to FIG. 7, in one embodiment, a flow diagram 700 for a method of setting an appropriate trickle current for a dielectric device is shown. According to the method, which is implemented during the design phase of a circuit, all the weak devices are identified (Step 705). The circuit is powered-down or put in standby mode (Step 710). The trickle current is set to zero amperes (Step 715). Next, the voltages Vgs, Vds, and Vgd for all the dielectric devices are checked (Step 720). If the voltages are below the stress tolerable limit, the trickle current is properly set (Step 725). If the voltages are not below the stress tolerable limit (e.g., less than 1.2V), the trickle current is incrementally increased in 0.1 µA increments (up to 10 µA maximum) (Step 730). The voltages Vgs, Vds, and Vgd for all the dielectric devices are again checked (Step 720). This process is repeated until the voltages are below the stress tolerable limit and the trickle current is properly set (Step 725).

There are many advantages to the disclosed system and method. Typically, the bulks of the input CML differential pair (devices 515 and 520) are tied to the common source node via a large resistor. This is done to reduce Vgx by raising the bulk voltage to the same voltage level as the source of the CML differential pair. However, this approach requires a large layout area because the bulk is not tied to ground. The bulk therefore requires an isolated p-substrate well. With the present invention, weak devices can be used to boost overall circuit performance, and weak devices can be located inside the same well, and tied to the same ground level, which saves circuit layout space. Further, the disclosed system prevents circuit and device failure during power-up, power-down, and when the low voltage power supply Vdd 178 in a multiple power supply system is absent.

Variations, modifications, and other implementations of what is described herein may occur to those of ordinary skill in the art without departing from the spirit and scope of the invention. Accordingly, the invention is not to be defined only by the preceding illustrative description.

What is claimed is:

1. A system for protecting a weak device operating in a micro-electronic circuit comprising a high voltage power supply, the system comprising:
    a low voltage power supply detection circuit configured to detect circuit power-up, circuit power-down, and when the low voltage power supply is absent, and generate a control signal upon detection; and
    a controlled current mirror device configured to provide a trickle current to maintain a conduction channel in the weak device in response to the control signal received from the low voltage power supply detection circuit during one of circuit power-up, circuit power-down, and when the low voltage power supply is absent.

2. The system of claim 1 wherein the low voltage power supply detection circuit is configured to be in electrical communication with an output of a low voltage power supply and an output of the high voltage power supply.

3. The system of claim 2 wherein the controlled current mirror device is configured to be in electrical communication with the output of the low voltage power supply, the output of the high voltage power supply, and the weak device, and in electrical communication with the low voltage power supply detection circuit.

4. The system of claim 1 further comprising a reference current generator configured to be in electrical communication with the weak device and in electrical communication with the controlled current minor device, the reference current generator further configured to provide a reference current to the weak device during normal circuit operation.

5. The system of claim 4 wherein the controlled current mirror device is further configured to receive the reference current and selectively provide to the weak device one of a current equivalent to the reference current and the trickle current in response to the control signal received from the low voltage power supply detection circuit.

6. The system of claim 1 wherein the trickle current provided to maintain the conduction channel in the weak device is within the range of 0.1 µA to 10 µA.

7. The system of claim 1 wherein the weak device comprises a thin gate dielectric device, a short channel device, or a small width device.

8. The system of claim 1 wherein the conduction channel prevents voltages across a gate of the weak device from exceeding a tolerable limit.

9. The system of claim 1 wherein the high voltage power supply produces a voltage of greater than or equal to 1.3 volts and the low voltage power supply produces a voltage of less than 1.3 volts.

10. The system of claim 1 wherein the controlled current mirror device comprises a mirror current device and a trickle current device.

11. A method of protecting a weak device operating in a micro-electronic circuit comprising a high voltage power supply, the method comprising:
    providing a low voltage power supply detection circuit configured to detect circuit power-up, circuit power-down, and when the low voltage power supply is absent, and generate a control signal upon detection; and
    providing a controlled current mirror device configured to provide a trickle current to maintain a conduction channel in the weak device in response to the control signal received from the low voltage power supply detection circuit during one of circuit power-up, circuit power-down, and when the low voltage power supply is absent.

12. The method of claim 11 wherein the low voltage power supply detection circuit is configured to be in electrical communication with an output of a low voltage power supply and an output of the high voltage power supply.

13. The method of claim 12 wherein the controlled current mirror device is configured to be in electrical communication with the output of the low voltage power supply, the output of the high voltage power supply, and the weak device, and in electrical communication with the low voltage power supply detection circuit.

14. The method of claim 11 further comprising providing a reference current generator configured to be in electrical communication with the weak device and in electrical communication with the controlled current mirror device, the reference current generator further configured to provide a reference current to the weak device during normal circuit operation.

15. The method of claim 14 wherein the controlled current mirror device is further configured to receive the reference current and selectively provide to the weak device one of a current equivalent to the reference current and the trickle current in response to the control signal received from the low voltage power supply detection circuit.

16. The method of claim 11 wherein the trickle current provided to maintain the channel in the weak device is within the range of 0.1 µA to 10 µA.

17. The method of claim 11 wherein the weak device comprises a thin gate dielectric device, a short channel device, or a small width device.

18. A high-speed micro-electronic circuit system comprising a system for protecting weak devices, comprising:
    a low voltage power supply detection circuit in electrical communication with an output of a low voltage power supply and an output of a high voltage power supply, the low voltage power supply detection circuit being configured to detect one of circuit power-up, circuit power-down, and when the low voltage power supply is absent, and generating a control signal upon detection; and
    a controlled current mirror device in electrical communication with the output of the low voltage power supply, the output of the high voltage power supply, the weak devices, and the low voltage power supply detection circuit, the controlled current mirror device providing a trickle current to maintain a conduction channel in each of the weak devices in response to the control signal received from the low voltage power supply detection circuit during one of circuit power-up, circuit power-down, and when the low voltage power supply is absent.

19. A method for setting a trickle current to a weak device in a micro-electronic circuit in order to protect the weak device, comprising:

(a) identifying the weak device;

(b) powering down the weak device or putting the weak device in a stand-by mode;

(c) setting the trickle current to the weak device to substantially zero amperes;

(d) measuring a gate to source voltage (Vgs), a drain to source voltage (Vds), and a gate to drain voltage (Vgd) for the weak device to determine if any of Vgs, Vds, and Vgd are above a tolerable limit;

(e) increasing the trickle current from the substantially zero amperes incrementally if any of Vgs, Vds, and Vgd are above the tolerable limit; and (f) repeating steps (d) and (e) until Vgs, Vds, and Vgd are below the tolerable limit.

* * * * *